US006839370B2

(12) United States Patent
Peters et al.

(10) Patent No.: US 6,839,370 B2
(45) Date of Patent: Jan. 4, 2005

(54) OPTOELECTRONIC DEVICE USING A DISABLED TUNNEL JUNCTION FOR CURRENT CONFINEMENT

(75) Inventors: Frank H. Peters, San Jose, CA (US); Michael H. Leary, Fremont, CA (US); Yoon-Kyu Song, San Jose, CA (US); Frederick A. Kish, Jr., Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 288 days.

(21) Appl. No.: 10/040,167

(22) Filed: Dec. 31, 2001

(65) Prior Publication Data

US 2003/0123505 A1 Jul. 3, 2003

(51) Int. Cl.[7] .................................................. H01S 5/00
(52) U.S. Cl. .......................................... 372/46; 372/45
(58) Field of Search ............................... 372/43–50, 96; 257/86; 438/46

(56) References Cited

U.S. PATENT DOCUMENTS

| 6,046,065 | A | * | 4/2000 | Goldstein et al. | 438/46 |
| 6,052,398 | A | * | 4/2000 | Brillouet et al. | 372/46 |
| 6,542,531 | B2 | * | 4/2003 | Sirbu et al. | 372/46 |

FOREIGN PATENT DOCUMENTS

| DE | 19954343 | 5/2001 |
| JP | 2000277853 | 6/2000 |
| WO | WO 98/07218 | 2/1998 |
| WO | WO02/45223 | 6/2002 |

OTHER PUBLICATIONS

Indium Phosphide and Related Materials, 1999. IPRM. 1999 11th International Conference on May 16–20, 1999, IEEE, pp. 211–214, S. Sekiguchi et al. "Selectively formed A1As/InP current confining tunnel junction for GaInAsP/InP surface emitting lasers".

Boucart, J. et al., "Implantaton Optimization For 1.55 um VCSEL," 11th International Conference on Indium Phosphide and Related Materials, May 16–20, 1999, Davos, Switzerland, IEEE 0-7803-5562, pp. 87–90 (Aug. 1999).

Ortsiefer, M. et al., "Room temperature Operaton of Index–guided 1.55 um InP–based Vertical–Cavity Surface–emitting Laser," Electronics Letters, vol. 36, No. 5, pp. 437–439 (Mar. 2, 2000).

Sekiguchi, S. et al., "Selectively Formed AIAs/InP Current Confining Tunnel Junction For GaInAsP/InP Surface Emitting Lasers," 11th International Conference on Indium Phosphide and Related Materials, May 16–20, 1999, Davos, Switzerland, IEEE 0-7803-5562, pp. 211–214 (Aug. 1999).

Sekiguchi, S. et al., "Long Wavelength GaInAsP/Inp Laser With Automatically Formed Tunneling Aperture," IEEE 0-7803-6320 pp. 451–454 (May 2000).

* cited by examiner

*Primary Examiner*—Quyen Leung

(57) ABSTRACT

An optoelectronic device such as a vertical cavity surface emitting laser (VCSEL) includes a tunnel junction that conducts a current of holes tunneling into an active region. Tunneling in a selected area of the tunnel junction is disabled to form a current blocking region that confines the current to desired regions. Tunneling can be disabled in the selected area using techniques including but not limited to implanting or diffusing dopants, disrupting crystal structure, or etching to remove part of the tunnel junction.

19 Claims, 2 Drawing Sheets

US 6,839,370 B2

OPTOELECTRONIC DEVICE USING A DISABLED TUNNEL JUNCTION FOR CURRENT CONFINEMENT

BACKGROUND

Optoelectronic devices such as vertical cavity surface emitting lasers (VCSELs) covert electrical current into light that can be used in optical communication signals or for other uses. The currents in such devices generally must be confined to specific regions for efficient conversion that minimizes power consumption and maintains a desirable optical field profile. Accordingly, such devices generally have current blocking structures that confine current to the desired regions. These current-blocking structures can be formed using a variety of techniques such as implantation, lateral oxidation, and etching with or without subsequent re-growth. All of these techniques have difficulties and limitations.

Implantation for current confinement relies on damaging the crystal lattice of a material in the optoelectronic device to render the material non-conductive. The nature of ion implantation processes causes poor localization of the implanted region. As a result, the boundary between an implanted region and a non-implanted region is soft, which leads to current flow through mildly implanted regions. Additionally, the implant can introduce defects that eventually lead to device degradation.

Lateral oxidation for current confinement is currently the method of choice for high performance VCSELs. Lateral oxidation can achieve a very sharp current aperture that for small (<10 $\mu$m) devices results in much higher performance than implantation can achieve. However, the oxidation process typically changes a material with a high aluminum concentration into oxide of the same material and is therefore very disruptive to the crystal lattice. As a result, device degradation that can be traced to the oxidation is seen in VCSELs that use lateral oxidation for confinement.

Optoelectronic devices with etched features tend to provide poor performance unless a complicated and costly re-growth is performed. Further, for VCSELs, re-growth has so far been unable to provide the high performance found in other semiconductor diode lasers.

New current confinement techniques are sought to overcome the limitations of the known techniques used in optoelectronic devices.

SUMMARY

In accordance with an aspect of the invention, a semiconductor optoelectronic device such as a vertical cavity surface emitting laser (VCSEL) includes a tunnel junction that is rendered inoperative in selected areas. The tunnel junction can be produced during epitaxial growth for the semiconductor device and is an operating feature of the semiconductor device. Where operative, the tunnel junction changes the majority carriers for the current in a semiconductor from electrons to holes. Specific areas of the tunnel junction are rendered inoperative to define a current blocking region. Where inoperative, the tunnel junction acts as a standard reverse biased diode and blocks current. A variety of mechanisms including implantation, diffusion, impurity induced disordering, and etching with re-growth can render specific areas of a tunnel junction inoperative.

One specific embodiment of the invention is an optoelectronic device such as a VCSEL. The optoelectronic device includes: an active region typically composed of layers of (Al)GaAs; a p-type semiconductor region that is typically a layer of p-type (Al)GaAs; an upper and lower n-type semiconductor regions that are typically layers of n-type (Al)GaAs; a tunnel junction between the p-type and upper n-type semiconductor regions; and a current blocking region between the active region and the n-type semiconductor region. The current blocking region operates as a reverse biased PN junction and confines a current that flows between the active region and the semiconductor region so that the current flows through the tunnel junction.

The current blocking region can have substantially the same structure as the tunnel junction and can be a portion of the tunnel junction in which tunneling has been disabled. For example, the current blocking region can be a portion of the tunnel junction that contains additional dopants that disable tunneling or a portion of the tunnel junction that has a disrupted crystal structure. Alternatively, a feature of the tunnel junction can be etched away or otherwise absent from the area of the current blocking region.

Another embodiment of the invention is a method for fabricating an optoelectronic device such as a VCSEL. The fabrication method begins by forming an active region or layer and a semiconductor region or layer with a tunnel junction between the two. Tunneling is then disabled in a selected part of the tunnel junction to form a current blocking region. During operation of the optoelectronic device, the tunnel junction conducts a current of holes tunneling between the active region and the semiconductor region. The current blocking region acts as a reverse-biased PN junction to block current.

Tunneling can be disabled using a variety of techniques. Such techniques include but are not limited to: implanting dopants into the selected part of the tunnel junction; diffusing N-type or P-type dopants into the selected part of the tunnel junction, disrupting crystal structure in the selected part of the tunnel junction, and disordering the structure of the tunnel junction with an impurity-induced or an impurity-free disordering process.

BRIEF DESCRIPTION OF THE DRAWINGS

Use of the same reference symbols in different figures indicates similar or identical items.

DETAILED DESCRIPTION

In accordance with an aspect of the invention, an optoelectronic device such as a vertical cavity surface emitting laser (VCSEL) includes a tunnel junction that is made inoperative in selected regions to confine current to a desired region, e.g., to where the tunnel junction is operable.

Figure 1:
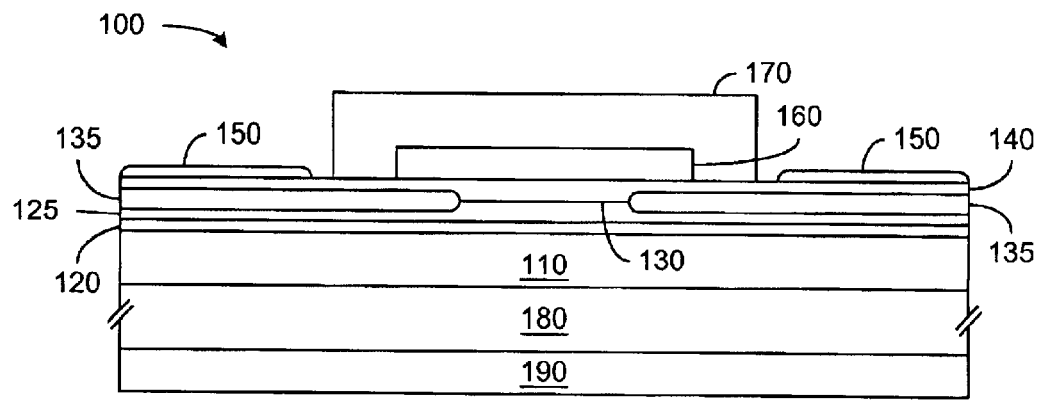
FIG. 1 shows a cross-sectional view of a VCSEL having a contact on the back of the wafer and a tunnel junction in accordance with an embodiment of the invention.

FIG. 1 schematically shows a cross-section of a VCSEL 100 in accordance with an embodiment of the invention.

VCSEL 100 includes a bottom reflector 110, an active layer 120, a p-type semiconductor layer 125, an n-type semiconductor layer 140, an index guide 160, and a top reflector 170.

Bottom reflector 110 is a highly reflective layer such as a distributed Bragg reflector (DBR) that can be formed on an underlying substrate 180. Generally, bottom reflector 110 has a reflectance that is as high as can reasonably be achieved. In VCSEL 100, which has a bottom contact 190 described further below, bottom reflector 110 and substrate 180 are conductive.

Top reflector 170 is vertically separated from bottom reflector 110 by a distance that defines the size of the laser cavity of VCSEL 100. Top reflector 170 can similarly be a DBR but has a reflectance and a transmittance selected according to the light amplification in active layer 120. Top reflector 170 transmits the light beam output from VCSEL 100.

Active layer 120 is made of a material such as (Al)GaAs or InGaAs(N)/(Al)GaAs that provides induced light emissions in response to light and recombination of electrons and holes in current passing through active layer 120. Layer 120 is typically about 1,000 to 10,000 Å and can be formed by traditional semiconductor crystal growth techniques such as Metal Organic Chemical Vapor Deposition (MOCVD) or Molecular Beam Epitaxy (MBE) on bottom reflector 110. In this embodiment, layers 110, 120, 125, 140 and 160 are semiconductor layers grown on substrate 180 in a single growth. In a typical embodiment of VCSEL 100, active layer 120 is undoped.

Layer 125 is p-doped to help support the relatively large reverse voltages across the disabled section of the tunnel junction, and to help transport holes to the active region with low resistance. The doping and thickness of layer 125 would generally be the minimum required to achieve these goals, in order to avoid optical loss associated with p-type doping and to avoid unnecessary lateral spreading of the holes injected from the operable portion of the tunnel junction. In an alternate embodiment, layer 125 could be integral with the heavily doped p-type half of tunnel junction 130.

N-type layer 140 similarly contains a semiconductor material such as GaAs typically about 1,000 to 5,000 Å thick but has an n-type doping.

A tunnel junction 130 is at the interface between layers 125 and 140. Tunnel junction 130 includes a thin heavily doped p++ layer (not shown) next to p-type layer 125 and a thin heavily doped n++ layer (not shown) next to n-type layer 140. In an exemplary embodiment of the invention, the thin p++ layer is about 200 Å or less thick and has a dopant concentration of about $1 \times 10^{19}$ to $1 \times 10^{20}$ cm$^{-3}$. The thin n++ layer is similarly about 200 Å less thick and has a dopant concentration of about $1 \times 10^{19}$ to $5 \times 10^{19}$ cm$^{-3}$.

Tunnel junction 130 can be formed by first depositing active layer 120 and p-type layer 125, changing the growth environment to deposit the thin layer having intrinsic p++ doping, changing the growth environment again to deposit the thin layer having intrinsic n++ doping, and finally depositing n-type layer 140.

The tunnel junction requires extraordinarily high doping levels, which often requires that the growth conditions for the tunnel junction layers be different from the growth conditions for active region 120 and surrounding layers 125 and 140. Besides adding high fluxes of the dopant species to the growth chamber, other growth conditions may also be changed to enhance the incorporation of the dopants into the semiconductor material. For example, in MOCVD growth, lowering the substrate temperature and reducing the ratio of the flow rate of group V element (typically As or P) carrier gases to the flow rate of the group III (typically In, Ga, or Al) carrier gases can enhance the incorporation of carbon, a p-type dopant, and allow the very high doping levels required for efficient tunneling. In MBE, the growth rate might be lowered to allow a higher ratio of flux of dopant atoms to flux of base material atoms. The specific conditions required to achieve extremely high doping levels will vary with the particular semiconductor being doped, the growth method used, the type of dopant, and even the particular model or brand of growth chamber.

In operation, n-type layer 140 is positively biased via a ring-shaped electrode 150 and active layer 120 is negatively biased via electrode structure 190 on the back surface of device 100. The bias voltage, which is typically about 2 volts for a conventional VCSEL, provides a reverse bias for a conventional NP junction. However, tunnel junction 130 conducts a current arising from quantum tunneling of electrons from the p++ layer of tunnel junction 130 to the n++ layer of tunnel junction 130, generating a corresponding electron current in n-type layer 140 and a hole current in active layer 120.

In accordance with an aspect of the invention, a current blocking region 135 formed in tunnel junction 130 confines the current to a portion of active region 120 under index guide 160. With tunneling disabled, current blocking region 135 operates as an ordinary reversed biased PN junction to prevent current flow outside of the desired area of active layer 120. Accordingly, recombination of electrons and holes from the tunneling current through tunnel junction 130 emits light in the laser cavity.

Blocking region 135 can be formed by any mechanism that disrupts tunneling through tunnel junction 130. One way to disrupt tunneling is to selectively implant dopants at a dose sufficient to render tunneling inoperative. The implantation can be performed through n-type layer 140 and therefore avoids the need to remove and return a wafer to a deposition chamber between formation of layers 120 and 140. Implantation disrupts tunneling by changing the doping profile of selected areas and/or disrupting the crystal lattice.

An advantage of this approach over a standard current blocking implanted device is that a small dose can be used because the implant only needs to disrupt tunneling and does not need to make the material non-conductive. In addition, this implant needs only affect the thin tunnel junction region, and therefore may be done with a single-energy implant. This is in contrast to a traditional implant-confined VCSEL, in which the ion implantation must render the semiconductor nonconductive throughout several microns of depth.

In the exemplary embodiment of the invention, for a tunnel junction located 3000 Å beneath the surface, a Beryllium implant of 100 keV with a dose of only about $1 \times 10^{11}$/cm$^2$ would be sufficient to compensate the dopants on the n-type side of the tunnel junction to a sufficient degree to virtually eliminate tunneling current. The smaller dose causes less damage, resulting in fewer defects that can affect reliability of the device. If a subsequent anneal is used in an impurity-induced disordering process as described below, an even lower implant dose could be used.

The tunnel junction helps to normalize or distribute the current density so that less current is crowded adjacent to the implant. Since VCSEL reliability is typically exponentially dependent on current density, the reduction in peak current density due to the current normalization can further improve device reliability. Another benefit of the current normalizing effect is a wider range of single-spatial-mode operation for VCSELs. Higher current injection near the edge of the confining aperture often creates a spatially nonuniform gain profile in conventional VCSELs which encourages the operation of multiple higher-order transverse spatial modes. Achieving a spatially uniform gain profile would increase the range of currents for which the fundamental lateral mode dominates the lasing action. This single-mode operation can be a vitally important property for VCSELs in communications applications.

Disordering can also render tunnel junction 130 inoperative in blocking region 135. Disordering makes the transitions between lightly and heavily doped regions less abrupt and thereby prevents significant tunneling current. If the disordering is impurity based, the addition of impurities, typically introduced via implantation, will accelerate the diffusion between the tunnel junction layers. An anneal process of time and temperature sufficient to cause slight diffusion of the tunnel junction layers where the impurities were implanted, but leave other regions relatively unchanged will normally follow the impurity implantation. Spatially patterning the implant of impurities, such as with a mask, can define apertures of operative tunnel junction.

Impurity free disordering can be used for ultra-low damage. In an impurity-free disordering process, lattice vacancies rather than impurities are introduced to the semiconductor to accelerate the diffusion process. This is often achieved by placing a silicon oxide cap on the surface of the semiconductor. The cap preferentially absorbs atoms from the semiconductor, leaving lattice vacancies behind. These vacancies diffuse rapidly themselves, and also greatly enhance the diffusion of the semiconductor atoms. If the silicon oxide cap or other vacancy source is spatially patterned, then an anneal process similar to the one described above could be used to diffuse and therefore destroy the tunneling action of a tunnel junction in a spatially selective way.

Typical ways of spatially patterning a cap are patterned removal of the cap, forming a patterned blocking layer such as a silicon nitride layer between the cap and the tunnel junction, or varying the distance between the cap and the tunnel junction by etching the semiconductor. Use of a cap to induce vacancies has the advantages of not causing the massive crystal damage associated with ion implantation and of preserving the electrical conductivity of the layers near the surface. These benefits would translate into improved device performance and reliability.

Yet another technique for disabling tunnel junction 130 in selected areas is to mask and etch all or part of tunnel junction 130 before formation of n-type layer 140. After the patterned etch, a wafer containing the device being manufactured is returned to the deposition chamber for formation of n-type layer 140, which electrodes 150 and index guiding layer 160 contact. With this technique, the current blocking region corresponds to the absence of tunnel junction 130 or of the n++ part of tunnel junction 130. The n-type layer 140 and either the p-type layer 125 or the p++ part of tunnel junction 130 form a reverse biased junction.

After forming current blocking region 135, device 100 is finished in a conventional manner. In particular, layer 160 is patterned and etched to form an index guide, one or more metal layers are formed and patterned to fabricate bias electrode 150 for n-type layer 140 and a bias electrode 190 for active layer 120. The layers forming top reflector 170 are deposited on index guide 160 and patterned to allow access to the metal contacts.

A tunnel junction with disabled regions for current confinement can be used in VCSELs having a variety of different architectures. Some of the architectural categories of most interest are those achieving low parasitic resistance and capacitance for high bandwidth operation. Reducing crosstalk between devices is also important, especially for high-bandwidth parallel arrays of devices. While the introduction of the tunnel junction to the structure allows the replacement of low-conductivity p-type material with high-conductivity n-type material for reduced parasitic resistance, oppositely biased layers can have a strong capacitive coupling through current blocking region 135.

Figure 2:
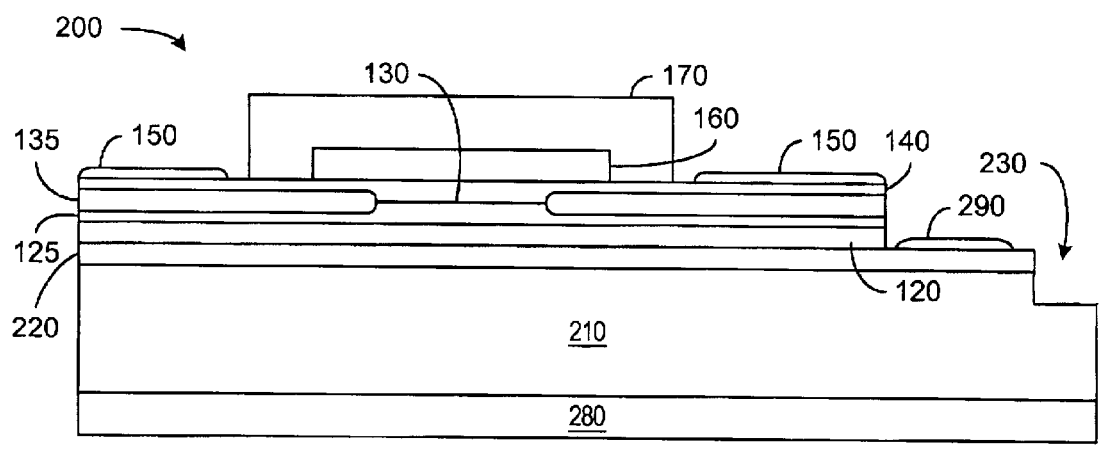
FIG. 2 shows a cross-sectional view of a VCSEL grown on a p-type or nonconductive substrate to allow device isolation and having an N-type layer under the active layer and a tunnel junction in accordance with an embodiment of the invention.

FIG. 2 illustrates an embodiment of the invention where a VCSEL 200 has a conductive n-type layer 220 underlying active layer 120, while a lower mirror 210 and a substrate 280 are nonconductive. In this embodiment, a lower contact 290 to the device is made from the top by etching that exposes n-type layer 220. The etching for the lower contact limits the area in which layers 140 and 120 are in close proximity, causing a corresponding decrease in the capacitance. An isolation trench 230 is then etched through the lower conductive layer 220 to eliminate any conductive path between devices and therefore virtually eliminates electrical crosstalk.

Figure 3:
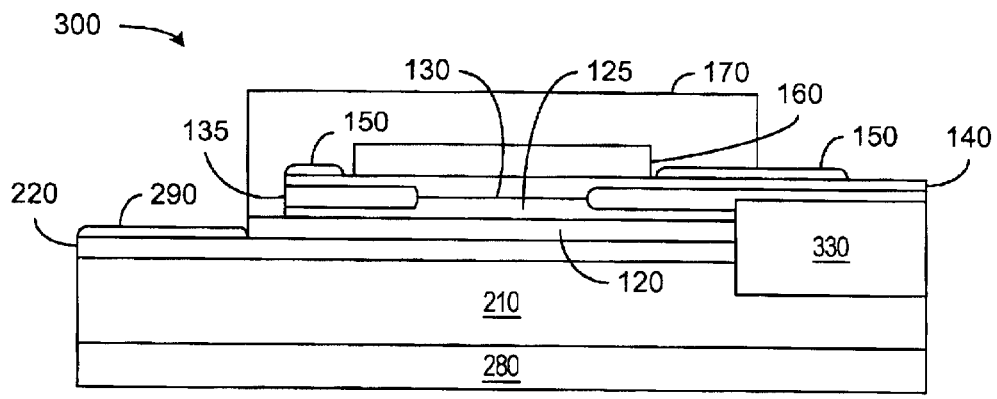
FIG. 3 shows a cross-sectional view of a VCSEL in accordance with an embodiment of the invention using a semi-planar architecture.

Planar architectures are often of interest in the manufacturing of VCSELs because planar or nearly planar surfaces are easier to pattern and coat than surfaces with deep trenches or tall pillars. FIG. 3 shows a VCSEL 300 having a semi-planar architecture in accordance with an embodiment of the invention. Similar to VCSEL 200, VCSEL 300 has a bias electrode 290 for active region 120 on a top surface of VCSEL 300 and in contact with conductive layer 220. Another feature of VCSEL 300 is a full isolation implant 330, which underlies a portion of n-type layer 140 and electrode 150. This isolation implant replaces the isolation trench 230 in VCSEL 200 and renders nonconductive layers 125, 120, and 220 down to nonconductive mirror 210. In addition to providing device isolation in a planar fashion, VCSEL 300 allows isolation implant 330 to extend underneath n-type layer 140 and contact 150 and further reduces parasitic capacitance beyond the reductions that VCSEL 200 achieves.

Figure 4:
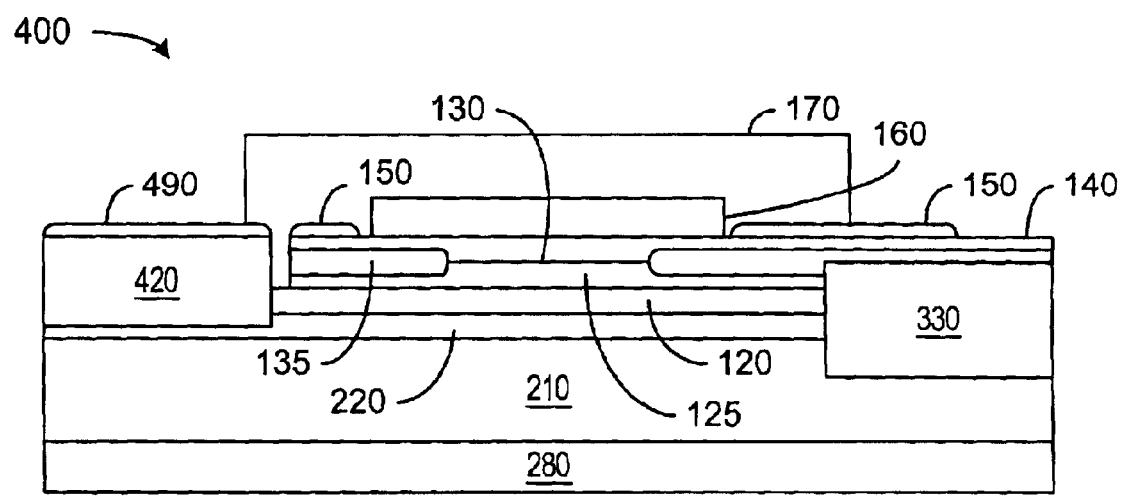
FIG. 4 shows a cross-sectional view of a VCSEL in accordance with an embodiment of the invention using a fully planar architecture.

FIG. 4 shows a VCSEL 400 having a fully planar architecture. This embodiment is similar to VCSEL 300 except that an implantation or diffusion process through blocking region 135 and layers 125 and 120 forms the electrical connection to layer 220. An n-type implant or a long contact alloy forming an n-type region 420 between metal bias electrode 490 and n-type layer 220 could implement this. Bias electrode 490 on n-type region 420 thus electrically connects to active layer 120 via region 420 and layer 220. In this implementation, only the top n-type layer 140 needs be etched to isolate region 420 from layer 140, leaving only an extremely shallow step on the wafer surface.

Aspects of the invention described above can be used in a number of optoelectronic devices but are especially suited to VCSELs. For VCSELs, the tunnel junction allows a reduction in the amount of p-type material required in the laser cavity. P-type material generally has lower conductivity and much higher optical losses than does n-type material. Accordingly, exchanging p-type material for n-type material can lower the operating voltage and the resistance of the device while also reducing the required threshold gain. Lower threshold gain results in higher differential gain, which improves the speed and reliability of the devices.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. An optoelectronic device comprising:
   an active region;
   a semiconductor region;
   a tunnel junction between the active region and the semiconductor region; and
   a current blocking region between the active region and the semiconductor region, wherein the current blocking region comprises a PN junction that is reverse biased during operation of the optoelectronic device and confines a current between the active region and the semiconductor region to the current through the tunnel junction.

2. The device of claim 1, wherein the current blocking region comprises a portion of the tunnel junction in which tunneling has been disabled.

3. The device of claim 1, wherein the current blocking region comprises a portion of the tunnel junction that contains an additional implant that disables tunneling.

4. The device of claim 1, wherein the current blocking region comprises a portion of the tunnel junction that contains additional dopants that disable tunneling.

5. The device of claim 1, wherein the current blocking region comprises a portion of the tunnel junction that has a disrupted crystal structure.

6. The device of claim 1, wherein:
   the tunnel junction comprises a heavily doped p-type region and a heavily doped n-type region between the active region and the semiconductor region; and
   the current blocking region comprises a structure that is the same as that of the tunnel junction, except that at least one of the heavily doped p-type region and the heavily doped n-type region is missing from the current blocking region.

7. The device of claim 1, wherein the current blocking region comprises a portion of the tunnel junction that has been partially diffused.

8. The device of claim 1, wherein the current blocking region comprises a portion of the tunnel junction that has been partially diffused by impurity-induced disordering.

9. The device of claim 1, wherein the current blocking region comprises a portion of the tunnel junction that has been partially diffused by impurity-free disordering.

10. The device of claim 1, wherein the optoelectronic device is a vertical cavity surface emitting laser.

11. A method for fabricating an optoelectronic device, comprising:
    forming an active region and a semiconductor region with a tunnel junction between the active region and the semiconductor region, wherein during operation of the optoelectronic device, the tunnel junction conducts a current between the active region and the semiconductor region; and
    disabling tunneling in a selected part of the tunnel junction to form a current blocking region, wherein the current blocking region comprises a PN junction that during operation of the optoelectronic device, is reverse biased and restricts current between the active region and the semiconductor region.

12. The method of claim 11, wherein disabling tunneling comprises ion implantation into the selected part of the tunnel junction.

13. The method of claim 12, wherein the implanted species comprise n-type dopants.

14. The method of claim 12, wherein the implanted species comprise p-type dopants.

15. The method of claim 12, wherein the implanted species comprise an ion that reduces the conductivity of the material into which it is implanted.

16. The method of claim 11, wherein disabling tunneling comprises disrupting the crystal structure in the selected part of the tunnel junction.

17. The method of claim 11, wherein disabling the tunneling comprises partially diffusing the tunnel junction via impurity-induced disordering.

18. The method of claim 11, wherein disabling the tunneling comprises partially diffusing the tunnel junction via impurity-free disordering.

19. The method of claim 11, wherein the optoelectronic device is a vertical cavity surface emitting laser.

* * * * *